United States Patent
Pandey et al.

(10) Patent No.: US 11,848,374 B2
(45) Date of Patent: Dec. 19, 2023

(54) BIPOLAR JUNCTION TRANSISTORS INCLUDING A PORTION OF A BASE LAYER INSIDE A CAVITY IN A DIELECTRIC LAYER

(71) Applicant: GlobalFoundries U.S. Inc., Malta, NY (US)

(72) Inventors: Shesh Mani Pandey, Saratoga Springs, NY (US); Jagar Singh, Clifton Park, NY (US); Judson Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 51 days.

(21) Appl. No.: 17/574,785

(22) Filed: Jan. 13, 2022

(65) Prior Publication Data

US 2023/0084007 A1    Mar. 16, 2023

Related U.S. Application Data

(60) Provisional application No. 63/257,819, filed on Oct. 20, 2021, provisional application No. 63/242,826, filed on Sep. 10, 2021.

(51) Int. Cl.
*H01L 29/737* (2006.01)
*H01L 29/66* (2006.01)
*H01L 21/762* (2006.01)
*H01L 29/06* (2006.01)

(52) U.S. Cl.
CPC ...... *H01L 29/737* (2013.01); *H01L 21/76289* (2013.01); *H01L 29/0649* (2013.01); *H01L 29/66242* (2013.01)

(58) Field of Classification Search
CPC .............. H01L 29/737; H01L 29/0649; H01L 29/66242; H01L 29/0692; H01L 29/1008; H01L 29/6625; H01L 29/7317; H01L 29/735; H01L 21/76289; H01L 21/764
See application file for complete search history.

(56) References Cited

U.S. PATENT DOCUMENTS

| | | | |
|---|---|---|---|
| 8,962,436 B2 * | 2/2015 | Cai | ................. H01L 29/737 438/335 |
| 9,502,504 B2 * | 11/2016 | Cai | ................. H01L 29/1008 |
| 9,536,788 B1 * | 1/2017 | Ning | ................. H01L 29/66265 |
| 9,748,369 B2 | 8/2017 | Liu | |
| 2012/0235151 A1 * | 9/2012 | Cai | ................. H01L 29/66265 257/65 |
| 2013/0168822 A1 * | 7/2013 | Clark, Jr. | ......... H01L 27/1203 257/E21.375 |

(Continued)

*Primary Examiner* — Dao H Nguyen
(74) *Attorney, Agent, or Firm* — Thompson Hine LLP; Francois Pagette

(57) ABSTRACT

Structures for a bipolar junction transistor and methods of forming a structure for a bipolar junction transistor. The structure includes a dielectric layer having a cavity, a first semiconductor layer on the dielectric layer, a collector including a portion on the first semiconductor layer, an emitter including a portion on the first semiconductor layer, and a second semiconductor layer that includes a first section in the cavity and a second section. The second section of the second semiconductor layer is laterally positioned between the portion of the collector and the portion of the emitter.

20 Claims, 8 Drawing Sheets

(56) References Cited

U.S. PATENT DOCUMENTS

| | | | |
|---|---|---|---|
| 2013/0260526 A1* | 10/2013 | Cai | H01L 29/66242 |
| | | | 257/E21.608 |
| 2017/0110450 A1* | 4/2017 | Ning | H01L 29/737 |
| 2020/0135895 A1 | 4/2020 | Pandey et al. | |

* cited by examiner

BIPOLAR JUNCTION TRANSISTORS INCLUDING A PORTION OF A BASE LAYER INSIDE A CAVITY IN A DIELECTRIC LAYER

CROSS-REFERENCE TO RELATED APPLICATIONS

This application claims the benefit of U.S. Provisional Application No. 63/257,819, filed Oct. 20, 2021 and U.S. Provisional Application No. 63/242,826, filed Sep. 10, 2021, which are hereby each incorporated by reference herein in their entirety.

BACKGROUND

This disclosure relates generally to semiconductor devices and integrated circuit fabrication and, in particular, to structures for a bipolar junction transistor and methods of forming a structure for a bipolar junction transistor.

A bipolar junction transistor is a multi-terminal electronic device that includes an emitter, a collector, and an intrinsic base arranged between the emitter and collector to define junctions. In a PNP bipolar junction transistor, the emitter and collector are comprised of p-type semiconductor material, and the intrinsic base is comprised of n-type semiconductor material. In an NPN bipolar junction transistor, the emitter and collector are comprised of n-type semiconductor material, and the intrinsic base is comprised of p-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates junctions that are heterojunctions. For example, the collector and emitter of a heterojunction bipolar transistor may be constituted by silicon, and the intrinsic base of a heterojunction bipolar transistor may be constituted by silicon-germanium, which is characterized by a narrower band gap than silicon.

Improved structures for a bipolar junction transistor and methods of forming a structure for a bipolar junction transistor are needed.

SUMMARY

In an embodiment, a structure for a bipolar junction transistor is provided. The structure includes a dielectric layer having a cavity, a first semiconductor layer on the dielectric layer, a collector including a portion on the first semiconductor layer, an emitter including a portion on the first semiconductor layer, and a second semiconductor layer that includes a first section in the cavity and a second section. The second section of the second semiconductor layer is laterally positioned between the portion of the collector and the portion of the emitter.

In an embodiment, a method of forming a structure for a bipolar junction transistor is provided. The method includes forming a collector including a portion on a first semiconductor layer, and forming an emitter including a portion on the first semiconductor layer. The first semiconductor layer is positioned on a dielectric layer. The method further includes forming a cavity in the dielectric layer, and forming a second semiconductor layer that includes a first section in the cavity and a second section. The second section of the second semiconductor layer is laterally positioned between the portion of the collector and the portion of the emitter.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
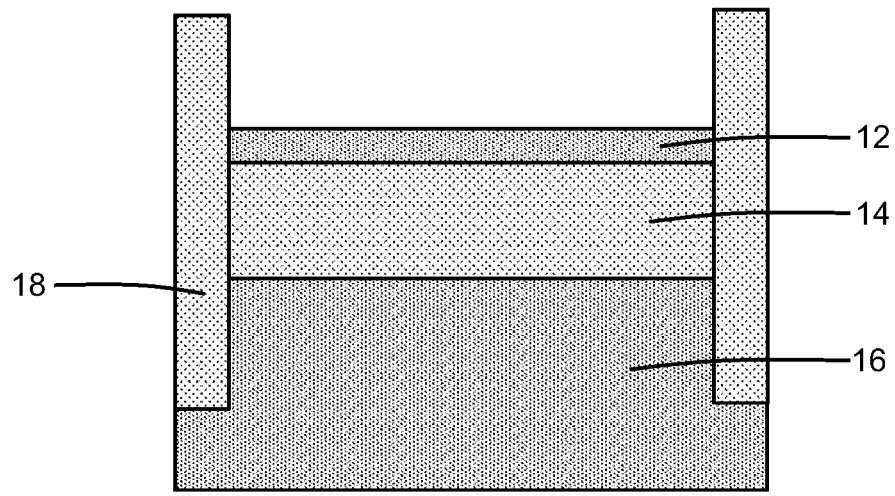
FIGS. 1-5 are cross-sectional views of a structure at successive fabrication stages of a processing method in accordance with embodiments of the invention.

With reference to FIG. 1 and in accordance with embodiments of the invention, a semiconductor-on-insulator substrate includes a device layer 12 defining a layer that contains a semiconductor material, a buried insulator layer 14, and a handle substrate 16. The device layer 12 is separated from the handle substrate 16 by the intervening buried insulator layer 14 and may also be considerably thinner than the handle substrate 16. In an embodiment, the device layer 12 may have a thickness in a range of about 4 nanometers (nm) to about 200 nm. In an embodiment, the device layer 12 may be used to fabricate fully-depleted silicon-on-insulator device structures.

The handle substrate 16 may be comprised of a semiconductor material, such as single-crystal silicon, and the buried insulator layer 14 may be a dielectric layer that is comprised of a dielectric material, such as silicon dioxide, that is an electrical insulator. The device layer 12 is electrically isolated from the handle substrate 16 by the buried insulator layer 14. The buried insulator layer 14 has a lower interface with the handle substrate 16 and an upper interface with the device layer 12, and the lower and upper interfaces are separated by the thickness of the buried insulator layer 14.

A trench isolation region 18 is formed that penetrates fully through the device layer 12 to the buried insulator layer 14. The trench isolation region 18 surrounds an active region represented by a section of the semiconductor material of the device layer 12. The trench isolation region 18 may be formed by a shallow trench isolation technique that patterns trenches in the device layer 12 with lithography and etching processes, deposits a dielectric material to overfill the trenches, and planarizes the dielectric material using chemical mechanical polishing and/or an etch back. The trench isolation region 18 may be comprised of a dielectric material, such as silicon dioxide, that is an electrical insulator.

The device layer 12 may be recessed and thinned by an etching process after the trench isolation region 18 is formed.

Figure 2:
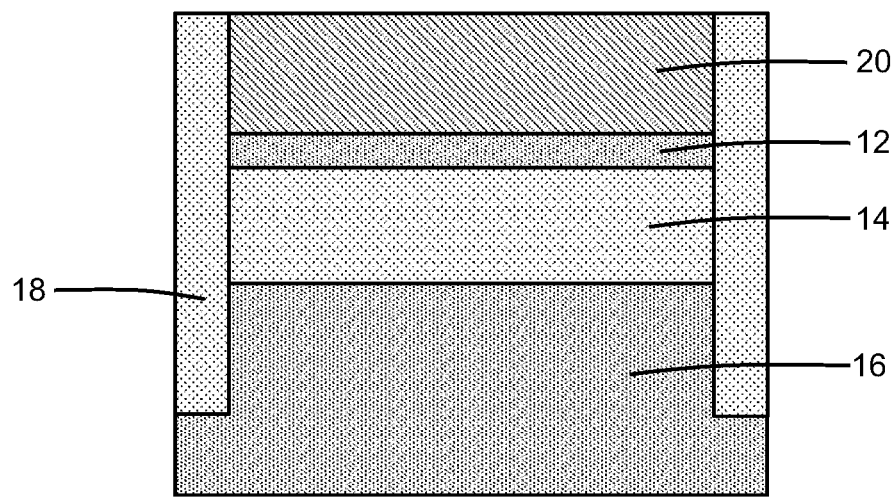

With reference to FIG. 2 in which like reference numerals refer to like features in FIG. 1 and at a subsequent fabrication stage, a semiconductor layer 20 is formed on the device layer 12 in the active region. The semiconductor layer 20 may be comprised of a semiconductor material, such as silicon. In an embodiment, the semiconductor layer 20 may be doped (e.g., heavily doped) with a concentration of a dopant, such as an n-type dopant (e.g., arsenic or phosphorus) to provide n-type conductivity. In an embodiment, the semiconductor layer 20 may be comprised of single-crystal semiconductor material (e.g., single-crystal silicon) formed by an epitaxial growth process. The epitaxial growth process may be selective in nature resulting in epitaxial growth from exposed semiconductor materials and not from exposed dielectric materials, such as the trench isolation region 18. The crystal structure of the single-crystal semiconductor material of the device layer 12 serves as a crystalline template for the crystal structure of the single-crystal semiconductor material of the semiconductor layer 20. In an embodiment, the device layer 12 beneath the semiconductor layer 20 may be doped (e.g., lightly-doped) to have the same conductivity type as the semiconductor layer 20 before the semiconductor layer 20 is formed and/or by dopant diffusion from the semiconductor layer 20.

Figure 3:
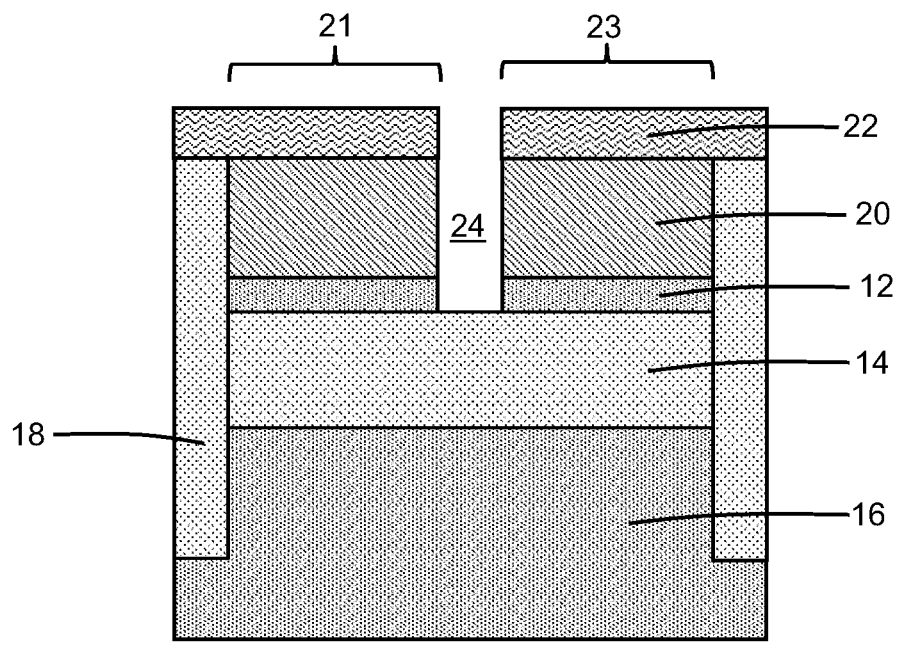

With reference to FIG. 3 in which like reference numerals refer to like features in FIG. 2 and at a subsequent fabrication stage, a patterned hardmask 22 is formed on the semiconductor layer 20, and an opening 24 is patterned by lithography and etching processes in the hardmask 22 that penetrates through the semiconductor layer 20 and the device layer 12 to the buried insulator layer 14. The hardmask 22 may be comprised of a dielectric material, such as silicon dioxide. The opening 24 splits and divides the semiconductor layer 20 into separated raised portions 21, 23 and also splits and divides the device layer 12 into separated portions. The raised portion 21 of the semiconductor layer 20 and the underlying portion of the device layer 12 are included in a terminal of a lateral bipolar junction transistor, and the raised portion 23 of the semiconductor layer 20 and the underlying portion of the device layer 12 are included in another terminal of the lateral bipolar junction transistor. The terminals provide an emitter and a collector of the lateral bipolar junction transistor.

Figure 4:
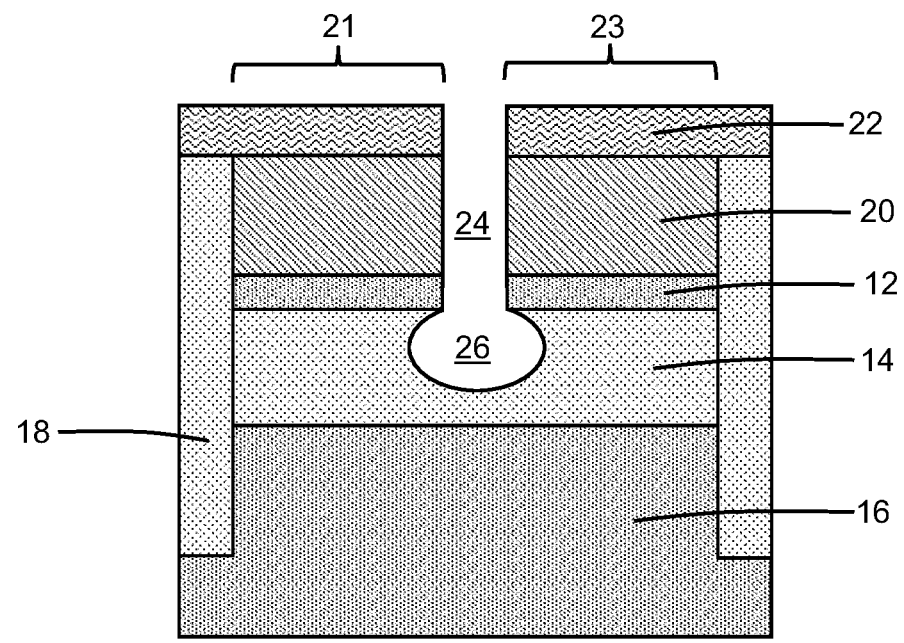

With reference to FIG. 4 in which like reference numerals refer to like features in FIG. 3 and at a subsequent fabrication stage, a cavity 26 is formed in the buried insulator layer 14 beneath the interface with the device layer 12 and above the interface with the handle substrate 16. In an embodiment, the cavity 26 in the buried insulator layer 14 may be centered relative to the opening 24. The cavity 26 is surrounded by, and embedded in, the dielectric material of the buried insulator layer 14. The cavity 26 may extend laterally beneath the portions of the device layer 12 that are respectively located beneath the raised portions 21, 23 of the semiconductor layer 20.

The cavity 26 may be formed by an isotropic etching process that removes the dielectric material of the buried insulator layer 14 selective to the semiconductor materials of the device layer 12 and semiconductor layer 20. The isotropic etching process includes a vertical etching component that deepens the cavity 26 and a lateral etching component that widens the cavity 26. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process.

Figure 5:
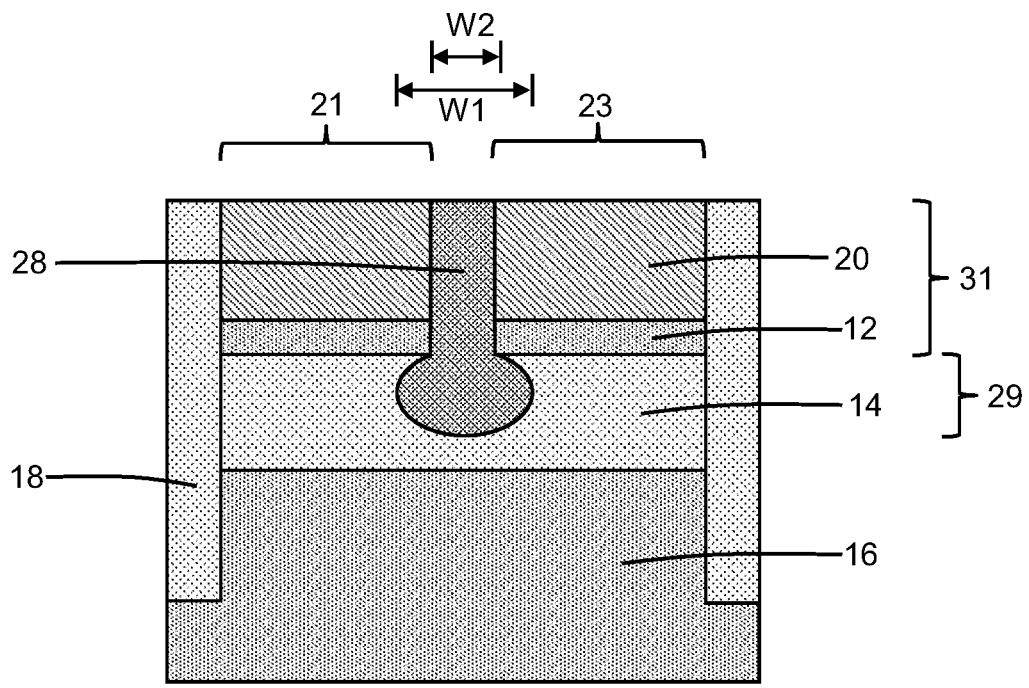

With reference to FIG. 5 in which like reference numerals refer to like features in FIG. 4 and at a subsequent fabrication stage, a semiconductor layer 28 is formed that includes a lower section 29 inside the cavity 26 in the buried insulator layer 14 and an upper section 31 inside the opening 24 and above the lower section 29. The semiconductor layer 28 may be comprised of a single-crystal semiconductor material that is epitaxially grown inside the cavity 26. In that regard, the semiconductor layer 28 may be formed by the epitaxial growth of semiconductor material from the surfaces of the device layer 12 and the raised portions 21, 23 of the semiconductor layer 20 bordering the opening 24. In an embodiment, the semiconductor layer 28 may be comprised at least in part, or entirely, of silicon-germanium. In an embodiment, the semiconductor layer 28 may be comprised at least in part, or entirely, of silicon-germanium including silicon and germanium with the silicon content ranging from 95 atomic percent to 50 atomic percent and the germanium content ranging from 5 atomic percent to 50 atomic percent. In an alternative embodiment, the semiconductor layer 28 may have a germanium content that is graded, for example, in a vertical direction, which may be accomplished during epitaxial growth by varying the reactants. In an alternative embodiment, the semiconductor material of the semiconductor layer 28 may be comprised of silicon and lack a germanium content. The semiconductor layer 28 may be in situ doped during epitaxial growth with a concentration of a dopant, such as a p-type dopant (e.g., boron) that provides p-type conductivity. In an embodiment, the semiconductor layer 28 may be uniformly doped. In an embodiment, the lower section 29 of the semiconductor layer 28 may have a higher dopant concentration than the upper section 31 of the semiconductor layer 28.

The upper section 31 of the semiconductor layer 28 directly contacts the adjacent portions of the device layer 12 and the adjacent raised portions 21, 23 of the divided semiconductor layer 20. The lower section 29 and upper section 31 of the semiconductor layer 28 are stacked in a vertical direction, and the lower section 29 of the semiconductor layer 28 has a width W1 that is greater than the width W2 of the upper section 31 of the semiconductor layer 28. The lower section 29 of the semiconductor layer 28 may extend laterally beneath the portions of the device layer 12 that are respectively located under the raised portions 21, 23 of the semiconductor layer 20.

The portions 21, 23 of the semiconductor layer 20 are masked by the hardmask 22 during the epitaxial growth of the semiconductor layer 28. In an embodiment, the semiconductor layer 28 may be formed by a selective epitaxial growth process in which the semiconductor material does not nucleate and form on dielectric surfaces, such as the surfaces of the hardmask 22. The hardmask 22 may be removed after forming the semiconductor layer 28.

The resultant structure is a lateral bipolar junction transistor that includes a laterally-arranged emitter, base, and collector and that is formed using a silicon-on-insulator substrate. The raised portions 21, 23 of the semiconductor layer 20 are included in the emitter and collector of the lateral bipolar junction transistor, and the upper section 31 of the semiconductor layer 28 provides the base (e.g., the intrinsic base) of the lateral bipolar junction transistor. In the representative embodiment, the semiconductor layer 20 may contain an n-type dopant, and the semiconductor layer 28 may contain a p-type dopant. In an alternative embodiment, the semiconductor layer 20 may contain a p-type dopant, and the semiconductor layer 28 may contain an n-type dopant.

The lateral bipolar junction transistor may be characterized by a controlled base width defined by the width of the opening 24, as well as a reduced base resistance and an improved high-frequency performance in comparison with conventional device structures. In particular, the volume of semiconductor material added by the lower section 29 of the semiconductor layer 28 inside the cavity 26, which is embedded in the dielectric material of the buried insulator layer 14 below the elevation of the device layer 12, may operate to reduce the base resistance.

Figure 6:
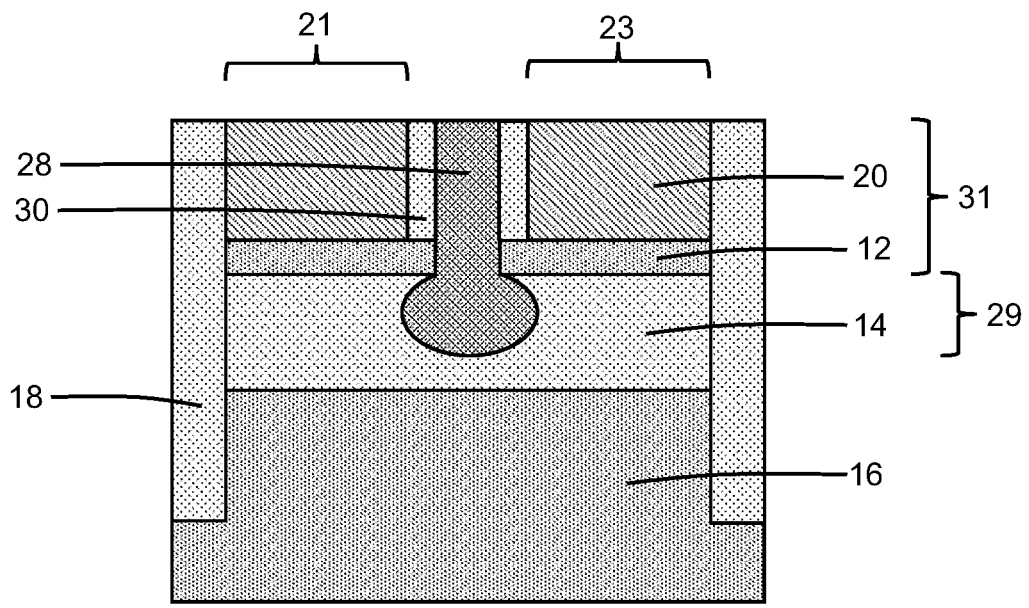
FIG. 6 is a cross-sectional view of a structure in accordance with alternative embodiments of the invention.

With reference to FIG. 6 and in accordance with alternative embodiments, spacers 30 may be formed on the sidewalls of the opening 24 before forming the cavity 26 in the buried insulator layer 14. The spacers 30 may be formed by directionally etching a conformally-deposited dielectric layer comprised of a dielectric material, such as silicon dioxide. The spacers 30 are laterally positioned between the semiconductor layer 28 and the raised portions 21, 23 of the semiconductor layer 20. The semiconductor layer 28 may be formed in the opening 24 and cavity 26 by the epitaxial growth of semiconductor material from the portions of the device layer 12 bordering the opening 24 as the spacers 30 prevent growth from the raised portions 21, 23 of the semiconductor layer 20.

The presence of the spacers 30 eliminates direct contact between the upper section 31 of the semiconductor layer 28 and the raised portions 21, 23 of the semiconductor layer 20. The upper section 31 of the semiconductor layer 28 directly contacts the adjacent portions of the device layer 12 that are beneath the raised portions 21, 23 of the semiconductor layer 20. The upper section 31 of the semiconductor layer 28 and the adjacent portions of the device layer 12 provide the junctions of the bipolar junction transistor.

Figure 7:
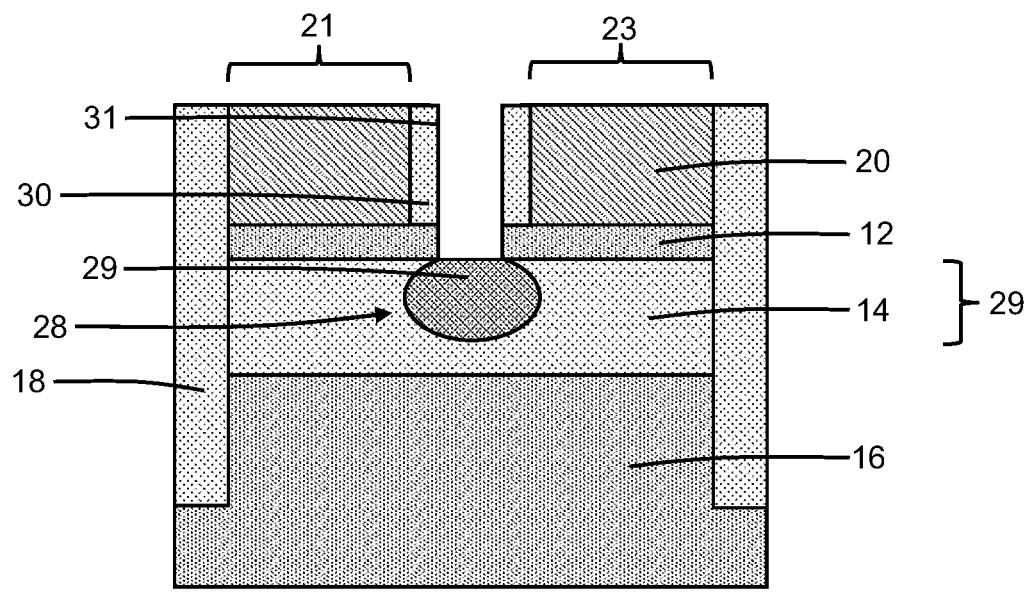
FIGS. 7-8 are cross-sectional views of a structure at successive fabrication stages of a processing method in accordance with alternative embodiments of the invention.

With reference to FIG. 7 and in accordance with alternative embodiments, the semiconductor layer 28 may be formed in stages. Specifically, the lower section 29 of the semiconductor layer 28 may be initially formed in the cavity 26. In that regard, the lower section 29 of the semiconductor layer 28 may be formed with a given set of properties, such as dopant concentration and germanium content.

Figure 8:
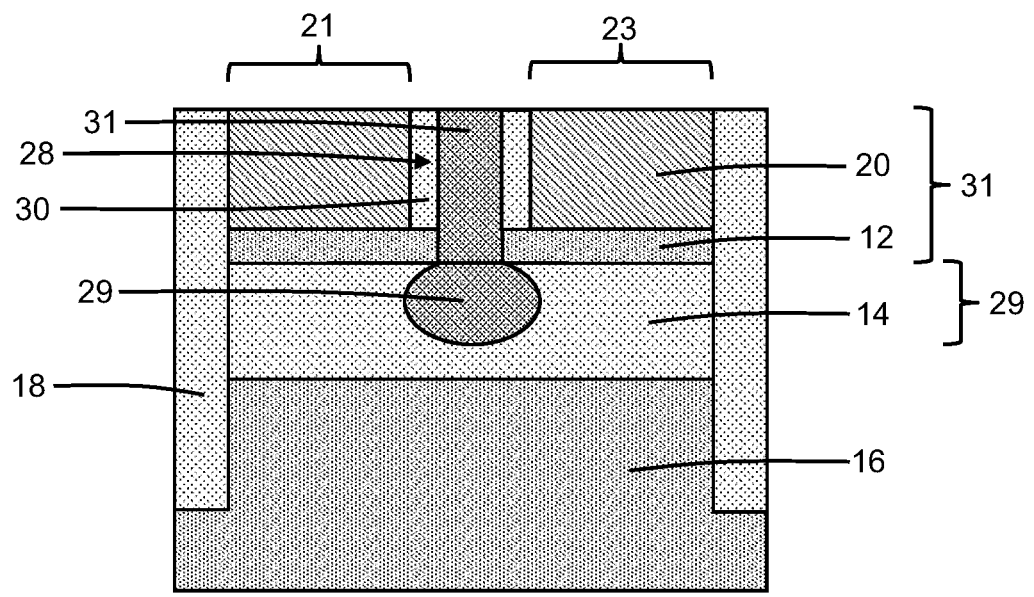

With reference to FIG. 8 in which like reference numerals refer to like features in FIG. 7 and at a subsequent fabrication stage, the upper section 31 of the semiconductor layer 28 may be subsequently formed in the opening 24 above the previously-formed lower section 29 of the semiconductor layer 28 inside the cavity 26. The upper section 31 of the semiconductor layer 28 may be formed with a given set of properties, such as dopant concentration or germanium content. The lower section 29 and upper section 31 of the semiconductor layer 28 may be formed with different properties, such as different dopant concentrations and/or different germanium contents, due to their separate formation by different epitaxial growth processes.

In an embodiment, the lower section 29 of the semiconductor layer 28 may have a higher dopant concentration than the upper section 31 of the semiconductor layer 28. In an embodiment, either the lower section 29 or the upper section 31 of the semiconductor layer 28 may be formed with grading of the germanium content. In an alternative embodiment, the lower section 29 and the upper section 31 of the semiconductor layer 28 may be formed with grading of the germanium content.

Figure 9:
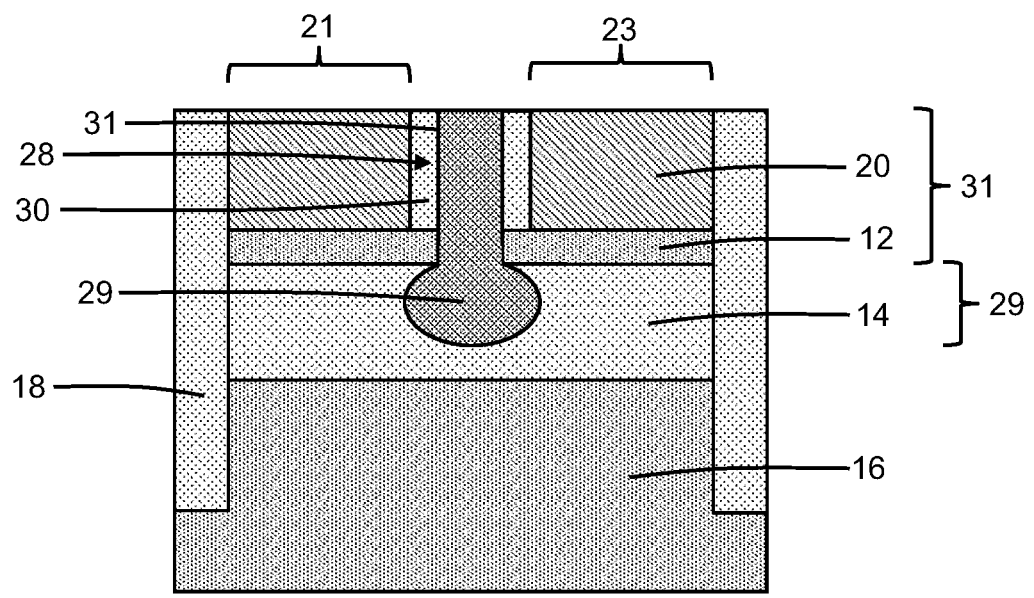
FIGS. 9-11 are cross-sectional views of a structure at successive fabrication stages of a processing method in accordance with alternative embodiments of the invention.

With reference to FIG. 9 and in accordance with alternative embodiments, the semiconductor layer 28 may be formed in stages in a different manner. Specifically, the semiconductor layer 28 may be initially formed inside the opening 24 and cavity 26. The semiconductor layer 28 may be formed with a given set of properties, such as dopant concentration and germanium content.

Figure 10:
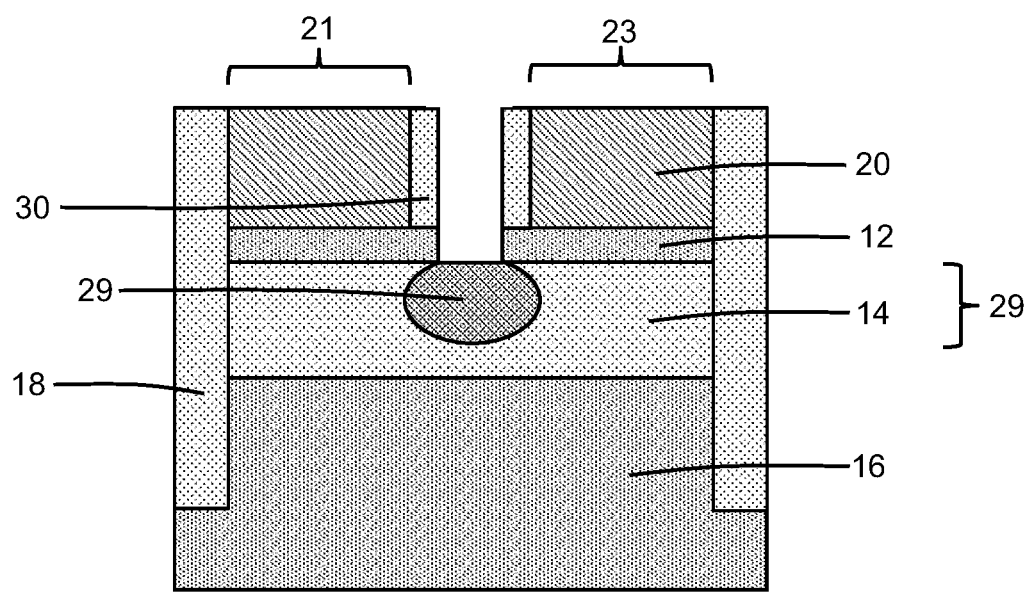

With reference to FIG. 10 in which like reference numerals refer to like features in FIG. 9 and at a subsequent fabrication stage, the semiconductor layer 28 may be partially removed by an etching process. For example, the upper section 31 of the semiconductor layer 28 may be fully removed from the opening 24 such that only the lower section 29 of the semiconductor layer 28 inside the cavity 26 remains.

Figure 11:
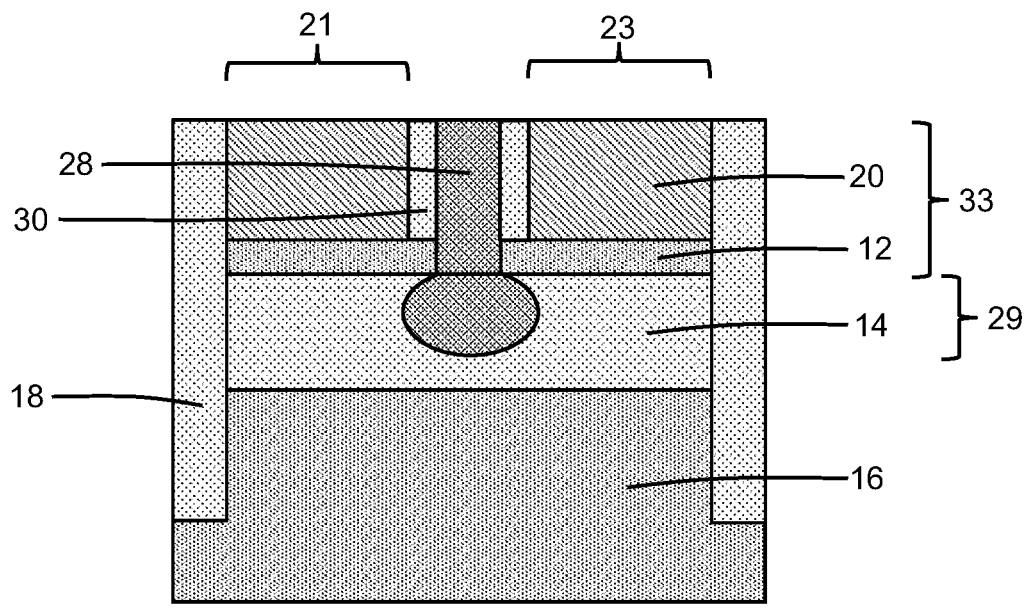

With reference to FIG. 11 in which like reference numerals refer to like features in FIG. 10 and at a subsequent fabrication stage, an upper section 33 of the semiconductor layer 28 is subsequently formed inside the opening 24 over the remaining lower section 29 inside the cavity 26 and as a replacement for the removed upper section 31. The upper section 33 of the semiconductor layer 28 may be formed with a given set of properties, such as dopant concentration and germanium content. The lower section 29 and upper section 33 of the semiconductor layer 28 may have different properties, such as different dopant concentrations and/or different germanium contents, due to their separate formation by different epitaxial growth processes.

In an embodiment, the lower section 29 of the semiconductor layer 28 may have a higher dopant concentration than the upper section 33 of the semiconductor layer 28. In an embodiment, either the lower section 29 or the upper section 33 of the semiconductor layer 28 may be formed with grading of the germanium content. In an alternative embodiment, the lower section 29 and the upper section 33 of the semiconductor layer 28 may be formed with grading of the germanium content.

Figure 12:
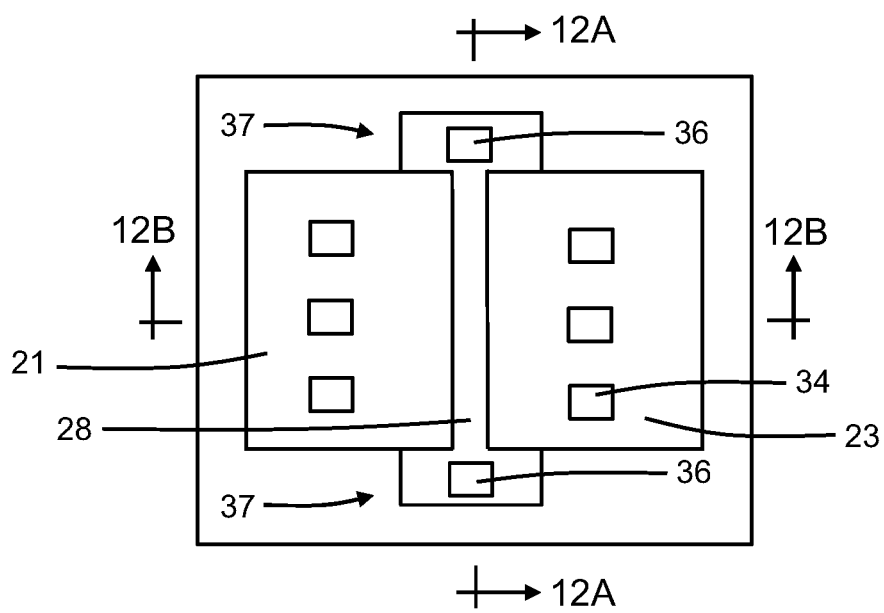
FIG. 12 is a layout for a structure in accordance with embodiments of the invention.
Figure 12A:
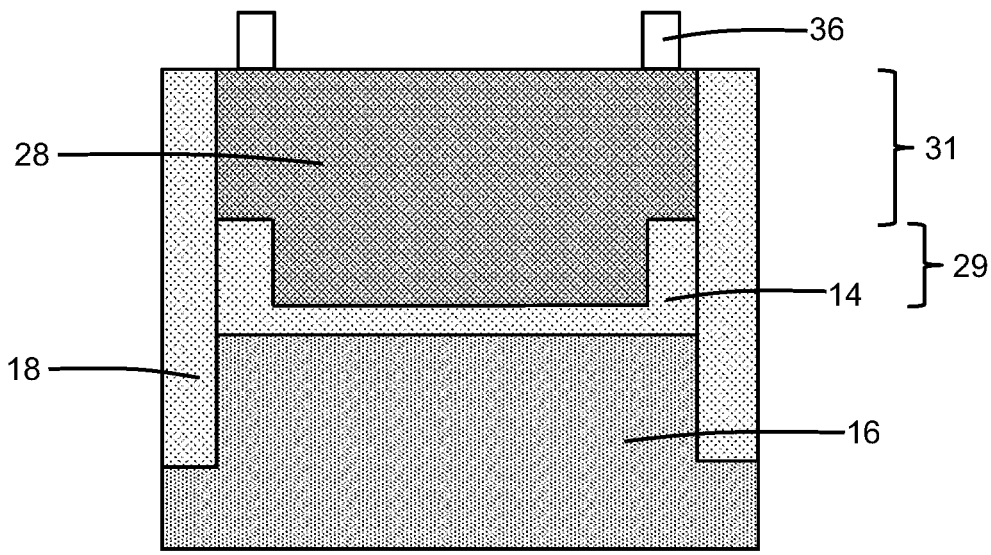
FIG. 12A is a cross-sectional view taken generally along line 12A-12A in FIG. 12.
Figure 12B:
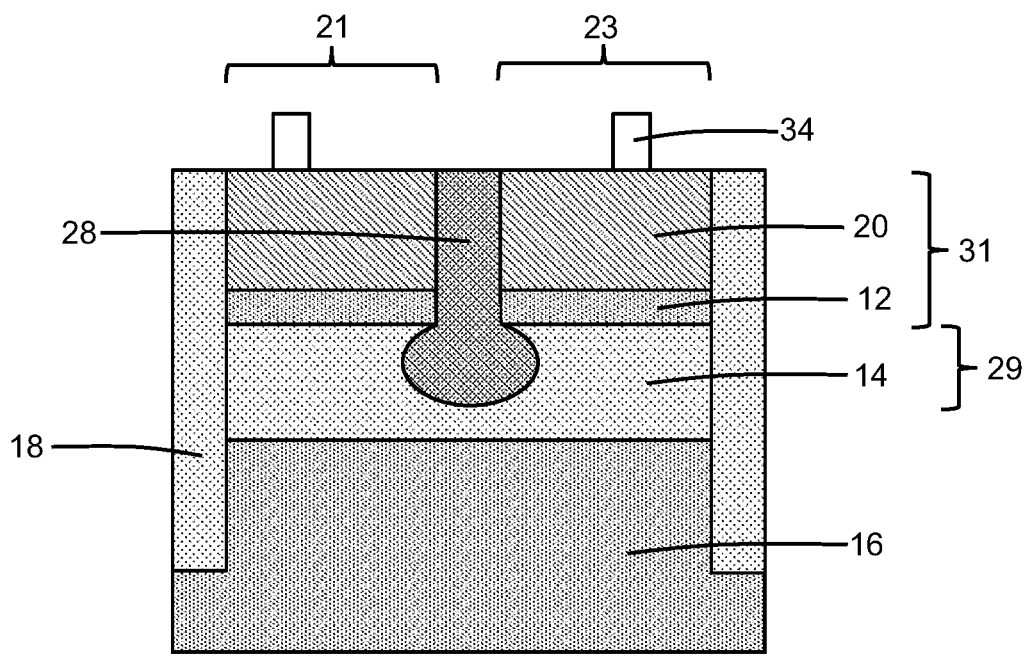
FIG. 12B is a cross-sectional view taken generally along line 12B-12B in FIG. 12.

With reference to FIGS. 12, 12A, 12B and in accordance with embodiments, the raised portions 21, 23 of the semiconductor layer 20 participating (along with the respective underlying sections of the device layer 12) to form the emitter and collector may be physically and electrically contacted from above by contacts 34, and the semiconductor layer 28 may be physically and electrically contacted by contacts 36 landed on widened end portions 37 located at the opposite ends of the semiconductor layer 28. The widened end portions 37 of the semiconductor layer 28 may be extensions of the upper section 31 of the semiconductor layer 28 and may not be undercut by the cavity 26, which may have a spatial extent in a longitudinal direction that is controlled when the cavity 26 is formed to prevent the undercut.

Figure 13:
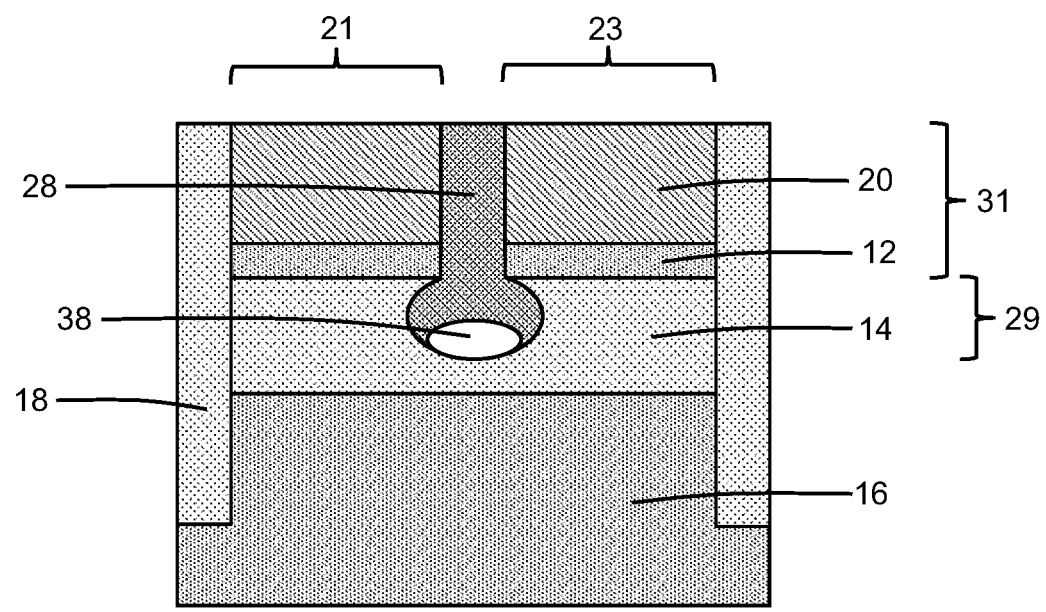
FIGS. 13 and 14 are cross-sectional views of structures in accordance with alternative embodiments of the invention.
Figure 14:
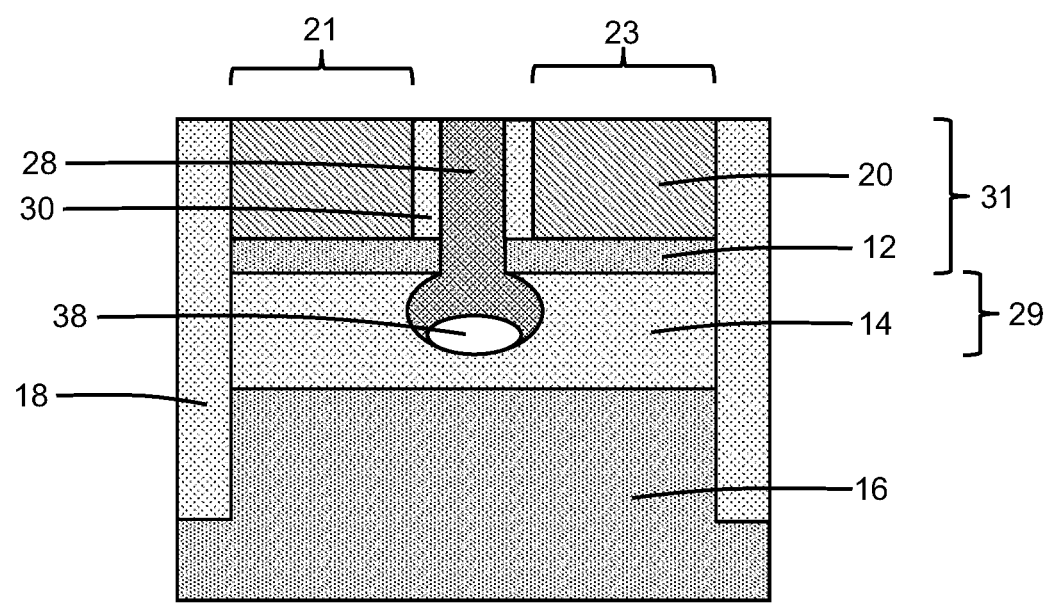

With reference to FIGS. 13, 14 and in accordance with embodiments, the cavity 26 may only be partially-filled by the lower section 29 of the semiconductor layer 28 for the structure without spacers 30 (FIG. 13) and the structure with spacers 30 (FIG. 14). A portion of the cavity 26 is enclosed by surfaces of the lower section 29 of the semiconductor layer 28 and the buried insulator layer 14 to define an airgap 38. The lower section 29 of the semiconductor layer 28 and the airgap 38 share the cavity 26.

The airgap 38 is a closed volume that may contain atmospheric air at or near atmospheric pressure, may contain another gas at or near atmospheric pressure, or may contain atmospheric air or another gas at a sub-atmospheric pressure (e.g., a partial vacuum). The airgap 38 may be characterized by a permittivity or dielectric constant of near unity (i.e., vacuum permittivity), which is less than the dielectric constant of a solid dielectric material.

The airgap 38 may be effective to reduce the base-collector capacitance and the base-emitter capacitance, which may lead to an improvement in, for example, maximum oscillation frequency (fmax) during device operation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a bipolar junction transistor, the structure comprising:
   a handle substrate;
   a dielectric layer on the handle substrate, the dielectric layer including a cavity;
   a shallow trench isolation region extending through the dielectric layer into the handle substrate;
   a first semiconductor layer on the dielectric layer;
   a collector including a first portion on the first semiconductor layer;
   an emitter including a first portion on the first semiconductor layer; and
   a second semiconductor layer including a first section in the cavity and a second section, the second section of the second semiconductor layer laterally positioned between the first portion of the collector and the first portion of the emitter.

2. The structure of claim 1 wherein the second section of the second semiconductor layer extends through the first semiconductor layer to the first section of the second semiconductor layer.

3. The structure of claim 1 wherein the dielectric layer includes a portion that separates the cavity from the handle substrate.

4. The structure of claim 1 wherein the second section of the second semiconductor layer provides an intrinsic base of the bipolar junction transistor.

5. The structure of claim 1 wherein the dielectric layer is comprised of a dielectric material, and the cavity is embedded in the dielectric material of the dielectric layer.

6. The structure of claim 1 further comprising:
   a first dielectric spacer laterally positioned between the first section of the second semiconductor layer and the first portion of the collector; and
   a second dielectric spacer laterally positioned between the first section of the second semiconductor layer and the first portion of the emitter.

7. The structure of claim 6 wherein the collector includes a second portion in the first semiconductor layer, the emitter includes a second portion in the first semiconductor layer, and the second section of the second semiconductor layer directly contacts the second portion of the collector and the second portion of the emitter.

8. The structure of claim 6 further comprising:
   an airgap in the cavity,
   wherein the first section of the second semiconductor layer and the airgap share the cavity.

9. The structure of claim 1 wherein the first section and the second section of the second semiconductor layer contain different concentrations of a dopant.

10. The structure of claim 1 wherein the first section of the second semiconductor layer has a higher dopant concentration than the second section of the second semiconductor layer.

11. The structure of claim 1 wherein the first section and/or the second section of the second semiconductor layer contain a graded concentration of a dopant.

12. The structure of claim 1 wherein the second semiconductor layer is comprised of a single-crystal semiconductor material.

13. The structure of claim 1 wherein the first section of the second semiconductor layer and the second section of the second semiconductor layer are arranged in a first direction, and the first section of the second semiconductor layer is wider than the second section of the second semiconductor layer in a second direction transverse to the first direction.

14. The structure of claim 1 wherein the second section of the second semiconductor layer directly contacts the first portion of the collector and the first portion of the emitter.

15. The structure of claim 1 wherein the second semiconductor layer includes an end portion extending laterally beyond the first portion of the collector and the first portion of the emitter, and further comprising:

a contact physically and electrically connected with the end portion.

16. A structure for a bipolar junction transistor, the structure comprising:

a dielectric layer including a cavity;

a first semiconductor layer on the dielectric layer;

a collector including a first portion on the first semiconductor layer;

an emitter including a first portion on the first semiconductor layer;

a second semiconductor layer including a first section in the cavity and a second section, the second section of the second semiconductor layer laterally positioned between the first portion of the collector and the first portion of the emitter; and an airgap in the cavity, wherein the first section of the second semiconductor layer and the airgap share the cavity.

17. A method of forming a structure for a bipolar junction transistor, the method comprising:

forming a shallow trench isolation region extending through a dielectric layer into a handle substrate;

forming a collector including a portion on a first semiconductor layer, wherein the first semiconductor layer is positioned on the dielectric layer;

forming an emitter including a portion on the first semiconductor layer;

forming a cavity in the dielectric layer; and forming a second semiconductor layer that includes a first section in the cavity and a second section, wherein the second section of the second semiconductor layer is laterally positioned between the portion of the collector and the portion of the emitter.

18. The method of claim 17 wherein the first section of the second semiconductor layer shares the cavity with an airgap.

19. The method of claim 17 wherein the dielectric layer is comprised of a dielectric material, and the dielectric material of the dielectric layer fully surrounds the cavity.

20. The method of claim 17 further comprising:

forming a first dielectric spacer and a second dielectric spacer over the first semiconductor layer before the cavity is formed, wherein the first dielectric spacer is laterally positioned between the first section of the second semiconductor layer and the portion of the collector, and the second dielectric spacer is laterally positioned between the first section of the second semiconductor layer and the portion of the emitter.

* * * * *